United States Patent
Wang et al.

(10) Patent No.: US 9,390,914 B2
(45) Date of Patent: Jul. 12, 2016

(54) WET OXIDATION PROCESS PERFORMED ON A DIELECTRIC MATERIAL FORMED FROM A FLOWABLE CVD PROCESS

(75) Inventors: Linlin Wang, Santa Clara, CA (US); Abhijit Basu Mallick, Palo Alto, CA (US); Nitin K. Ingle, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 816 days.

(21) Appl. No.: 13/396,410

(22) Filed: Feb. 14, 2012

(65) Prior Publication Data

US 2012/0142198 A1 Jun. 7, 2012

Related U.S. Application Data

(63) Continuation of application No. 12/643,196, filed on Dec. 21, 2009, now abandoned.

(51) Int. Cl.
*H01L 21/02* (2006.01)

(52) U.S. Cl.
CPC .... *H01L 21/02326* (2013.01); *H01L 21/02343* (2013.01)

(58) Field of Classification Search
CPC .............. H01L 21/02326; H01L 21/02343
See application file for complete search history.

(56) References Cited

U.S. PATENT DOCUMENTS

| | | | |
|---|---|---|---|
| 6,566,278 B1 | 5/2003 | Harvey et al. | |
| 6,596,343 B1 | 7/2003 | Pokharna et al. | |
| 6,614,181 B1 | 9/2003 | Harvey et al. | |
| 7,141,483 B2 | 11/2006 | Yuan et al. | |
| 7,247,582 B2 | 7/2007 | Stern et al. | |
| 7,326,657 B2 | 2/2008 | Xia et al. | |
| 7,335,609 B2 | 2/2008 | Ingle et al. | |
| 7,521,378 B2 | 4/2009 | Fucsko et al. | |
| 7,867,923 B2 | 1/2011 | Mallick et al. | |
| 2005/0026443 A1* | 2/2005 | Goo et al. | 438/694 |
| 2005/0136684 A1 | 6/2005 | Mukai et al. | |
| 2005/0142895 A1 | 6/2005 | Ingle et al. | |
| 2005/0255667 A1 | 11/2005 | Arghavani et al. | |
| 2005/0272220 A1 | 12/2005 | Waldfried et al. | |
| 2006/0046427 A1 | 3/2006 | Ingle et al. | |
| 2006/0105106 A1 | 5/2006 | Balseanu et al. | |
| 2006/0249175 A1 | 11/2006 | Nowak et al. | |
| 2006/0251827 A1 | 11/2006 | Nowak et al. | |
| 2007/0031598 A1 | 2/2007 | Okuyama et al. | |

(Continued)

FOREIGN PATENT DOCUMENTS

KR 1020060100243 9/2007

OTHER PUBLICATIONS

Yang et al. KR 10-2006-0100243 machine translation.*

(Continued)

*Primary Examiner* — Yasser A Abdelaziez
(74) *Attorney, Agent, or Firm* — Patterson & Sheridan, LLP

(57) ABSTRACT

Methods of performing a wet oxidation process on a silicon containing dielectric material filling within trenches or vias defined within a substrate are provided. In one embodiment, a method of forming a dielectric material on a substrate includes forming a dielectric material on a substrate by a flowable CVD process, curing the dielectric material disposed on the substrate, performing a wet oxidation process on the dielectric material disposed on the substrate, and forming an oxidized dielectric material on the substrate.

7 Claims, 5 Drawing Sheets

(56) References Cited

U.S. PATENT DOCUMENTS

| | | |
|---|---|---|
| 2007/0066005 A1 | 3/2007 | Hieda et al. |
| 2007/0212847 A1 | 9/2007 | Ingle et al. |
| 2007/0212850 A1 | 9/2007 | Ingle et al. |
| 2007/0228289 A1 | 10/2007 | Kaszuba et al. |
| 2007/0228618 A1 | 10/2007 | Kaszuba et al. |
| 2007/0257205 A1 | 11/2007 | Rocha-Alvarez et al. |
| 2007/0277734 A1* | 12/2007 | Lubomirsky et al. .......... 118/715 |
| 2007/0281495 A1* | 12/2007 | Mallick et al. ................. 438/778 |
| 2007/0281496 A1 | 12/2007 | Ingle et al. |
| 2007/0286963 A1 | 12/2007 | Rocha-Alvarez et al. |
| 2007/0289534 A1 | 12/2007 | Lubomirsky et al. |
| 2007/0295012 A1 | 12/2007 | Ho et al. |
| 2008/0020591 A1 | 1/2008 | Balseanu et al. |
| 2008/0067425 A1 | 3/2008 | Kaszuba et al. |
| 2009/0104755 A1 | 4/2009 | Mallick et al. |
| 2009/0120368 A1 | 5/2009 | Lubomirsky et al. |
| 2009/0277587 A1 | 11/2009 | Lubomirsky et al. |
| 2009/0280650 A1 | 11/2009 | Lubomirsky et al. |

OTHER PUBLICATIONS

PCT international search report and written opinion of PCT/US2010/055402 dated Jun. 29, 2011.

Chinese Search Report dated Mar. 3, 2014 for Application No. 201080055791.8.

* cited by examiner

WET OXIDATION PROCESS PERFORMED ON A DIELECTRIC MATERIAL FORMED FROM A FLOWABLE CVD PROCESS

CROSS-REFERENCE TO OTHER APPLICATIONS

This application is a continuation of co-pending U.S. Ser. No. 12/643,196, filed Dec. 21, 2009 which is herein incorporated by reference.

BACKGROUND OF THE INVENTION

1. Field of the Invention

The invention relates to a method for processing substrates, such as semiconductor wafers, and more particularly, to a method for wet oxidizing a dielectric material disposed on a substrate.

2. Description of the Related Art

Reliably producing sub-half micron and smaller features is one of the key technologies for the next generation of very large scale integration (VLSI) and ultra large-scale integration (ULSI) of semiconductor devices. However, as the limits of integrated circuit technology are pushed, the shrinking dimensions of interconnects in VLSI and ULSI technology have placed additional demands on processing capabilities. Integrated circuits may include more than one million microelectronic field effect transistors (e.g., complementary metal-oxide-semiconductor (CMOS) field effect transistors) that are formed on a substrate (e.g., semiconductor wafer) and cooperate to perform various functions within the circuit. Reliable formation of the gate pattern and shallow trench isolation (STI) regions are important to integrated circuits success and to the continued effort to increase circuit density and quality of individual substrates and die. In order to achieve greater circuit density, not only must device feature size be reduced, but the size of isolation structures between devices must be reduced as well.

Current isolation techniques include shallow trench isolation (STI) processes. STI processes include first etching a trench having a predetermined width and depth into a substrate. The trench is then filled with a layer of dielectric material. The dielectric material is then planarized by, for example, chemical-mechanical polishing (CMP) process.

As the width of trenches continues to shrink, the aspect ratio (depth divided by width) continues to grow. One challenge regarding the manufacture of high aspect ratio trenches is avoiding the formation of voids during the deposition of dielectric material in the trenches.

To fill a trench, a layer of dielectric material, such as silicon oxide, is deposited. The dielectric layer typically covers the field, as well as the walls and the bottom of the trench. If the trench is wide and shallow, it is relatively easy to completely fill the trench. However, as the aspect ratio increases, it becomes more likely that the opening of the trench will "pinch off", forming a void within the trench.

To decrease the likelihood of forming a void within the trench or forming seams within the trench, many different process techniques have been developed to fill in the trench with the dielectric materials without defects. For example, a conventional spray coating process may be used to fill in the trench with a liquid precursor to form a void-free or seam-free dielectric material in the trench. After the liquid precursor fills the trench, a high temperature annealing process is typically performed to drive out the moisture from the liquid precursor, thereby forming a dielectric material within the trench in a solid phase. However, this deposition technique often suffers from high film impurities as the liquid precursor used to fill in the trench may include contaminants that may adversely deteriorate on the electrical properties of the formed dielectric material which adversely affects device performance.

In another example, high aspect ratio processes (HARP) may be used to form the dielectric material. These processes include depositing the dielectric material at different rates during different stages of the deposition process. A lower deposition rate may be used to form a more conformal dielectric layer in the trench, and a higher deposition rate may be used to form a bulk dielectric layer above the trench. However, HARP processes often have low throughput, which results in high manufacturing cost.

Therefore, a need exists for improvements in processes and apparatus for producing high aspect ratio isolation structures.

SUMMARY OF THE INVENTION

Embodiments of this invention describe a process of forming an oxidized dielectric material on a substrate. The process provides substantially void-free or seam-free gap filling of trenches with the oxidized dielectric material. The process may be utilized to form a variety of insulating structures and devices. For example, the process may be used in forming shallow trench isolation (STI) devices and interlevel insulating layers, among other structures. In one embodiment, a method of forming an oxidized dielectric material on a substrate includes forming a dielectric material on a substrate by a flowable CVD process, curing the dielectric material disposed on the substrate, performing a wet oxidation process on the dielectric material disposed on the substrate, and forming an oxidized dielectric material on the substrate.

In another embodiment, a method of forming an oxidized dielectric material on a substrate includes forming a silicon containing layer on a substrate by a flowable CVD process, wherein the silicon containing layer having a formula of $Si_xN_yH_z$, curing the silicon containing layer disposed on the substrate, immersing the silicon containing layer into a processing solution having an oxygen source, wherein the oxygen source in the processing solution at least partially replaces silicon nitrogen or silicon hydrogen bonds in the silicon containing layer with silicon oxygen bonds, and forming an oxidized silicon containing layer on the substrate.

In yet another embodiment, a method of forming an oxidized dielectric material on a substrate includes forming a silicon containing layer on a substrate by a flowable CVD process, wherein the silicon containing layer is formed by exposure to a gas mixture containing trisillylamine (TSA) and $NH_3$, curing the silicon containing layer disposed on the substrate, wetting the silicon containing layer with a processing solution having $O_3$ disposed in deionized (DI) water, wherein the ozone disposed in the deionized (DI) water has a concentration between about 1 milligram (mg) per liter (L) and about 1000 milligram (mg) per liter, and forming an oxidized silicon containing layer on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Nonetheless, the teachings of the present invention can be readily understood by considering the following detailed description in conjunction with the accompanying drawings, in which.

To facilitate understanding, identical reference numerals have been used, where possible, to designate identical elements that are common to the figures. It is also contemplated that elements disclosed in one embodiment may be beneficially utilized on other embodiments without specific recitation.

DETAILED DESCRIPTION

Figure 1:
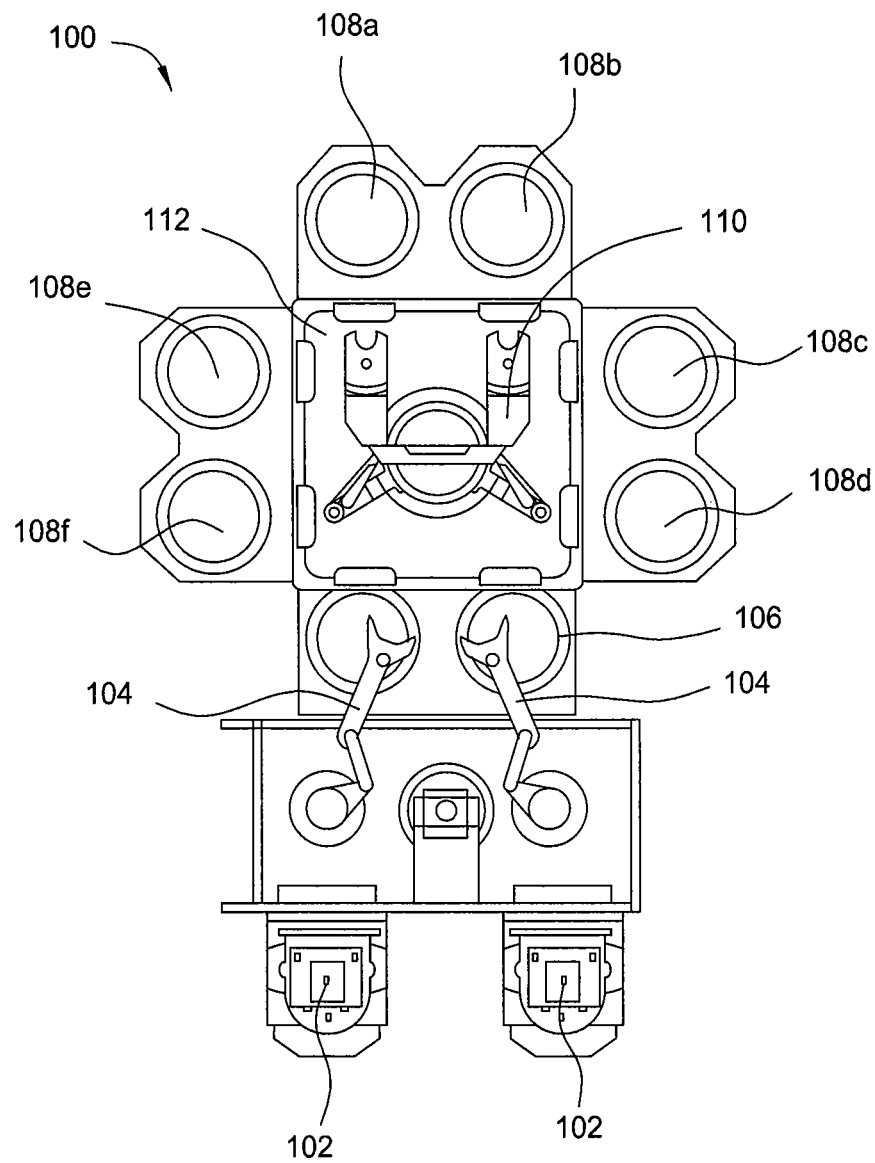
FIG. 1 is a top plan view of one embodiment of a processing tool.

FIG. 1 is a top plan view of one embodiment of a processing tool 100 of deposition, baking and curing chambers according to disclosed embodiments. In the processing tool 100, a pair of FOUPs (front opening unified pods) 102 supply substrate substrates (e.g., 300 mm diameter wafers) that are received by robotic arms 104 and placed into load lock chambers 106. A second robotic arm 110 is disposed in a transfer chamber 112 coupled to the load lock chambers 106. The second robotic arm 110 is used to transport the substrates from the load lock chambers 106 to processing chambers 108a-f coupled to the transfer chamber 112.

The processing chambers 108a-f may include one or more system components for depositing, annealing, curing and/or etching a flowable dielectric film on the substrate wafer. In one configuration, two pairs of the processing chamber (e.g., 108c-d and 108e-f) may be used to deposit the flowable dielectric material on the substrate, and the third pair of processing chambers (e.g., 108a-b) may be used to anneal/cure the deposited dielectric. In another configuration, the same two pairs of processing chambers (e.g., 108c-d and 108e-f) may be configured to both deposit and anneal/cure a flowable dielectric film on the substrate, while the third pair of chambers (e.g., 108a-b) may be used for UV or E-beam curing of the deposited film. In still another configuration, all three pairs of chambers (e.g., 108a-f) may be configured to deposit and cure a flowable dielectric material on the substrate.

In yet another configuration, two pairs of processing chambers (e.g., 108c-d and 108e-f) may be used for both deposition and UV or E-beam curing of the flowable dielectric material, while a third pair of processing chambers (e.g. 108a-b) may be used for annealing the dielectric material. It will be appreciated, that additional configurations of deposition, annealing and curing chambers for flowable dielectric films are contemplated by processing tool 100.

In addition, one or more of the process chambers 108a-f may be configured as a wet treatment/oxidation chamber. These process chambers include wet processing the flowable dielectric material in an environment that includes processing solution. Thus, embodiments of processing tool 100 may include wet treatment/oxidation chambers 108a-b and anneal processing chambers 108c-d to perform both wet and dry processes on the deposited dielectric material.

Figure 2:
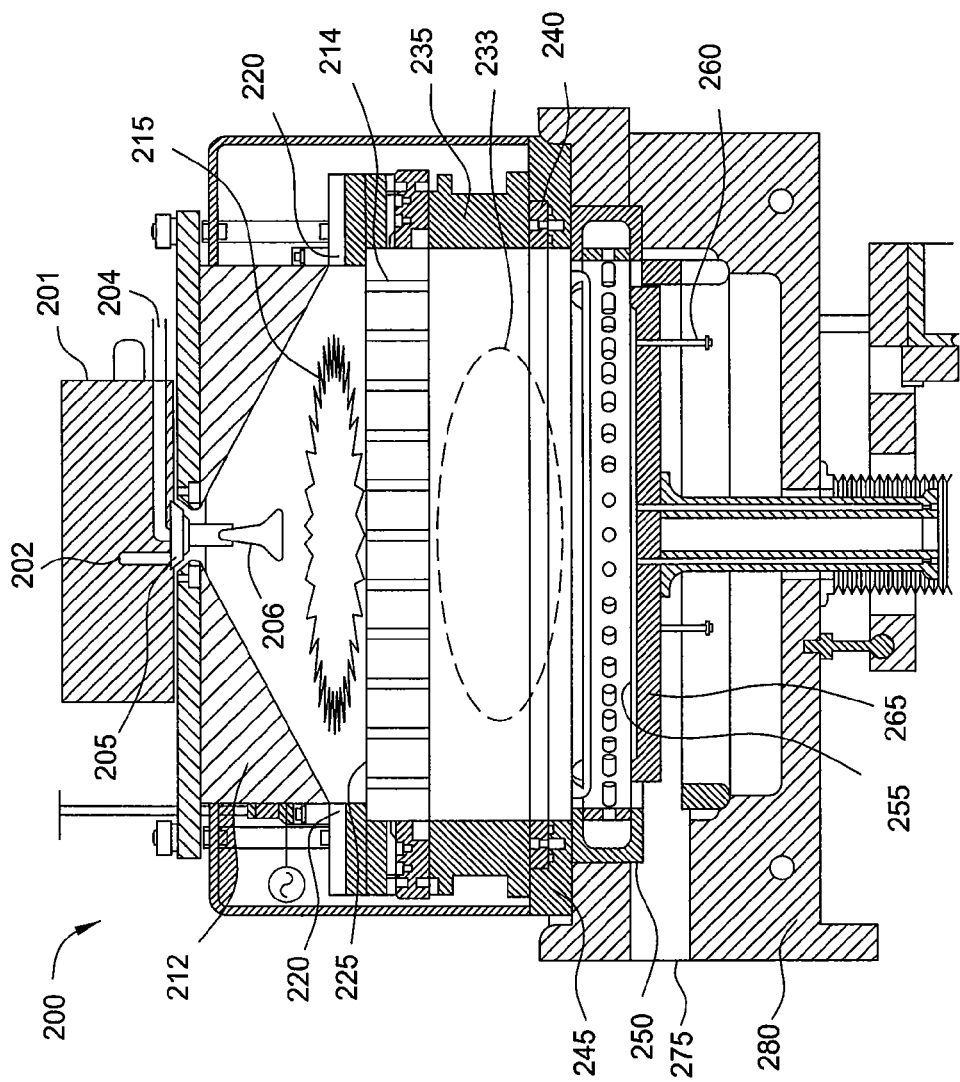
FIG. 2 is a schematic cross-sectional view of one embodiment of a processing chamber.

FIG. 2 is a cross-sectional view of one embodiment of a flowable chemical vapor deposition (i.e., process) chamber 200 with partitioned plasma generation regions. The process chamber 200 may be any of the processing chambers 108a-f that are configured at least for depositing a flowable dielectric material on a substrate. During film deposition (silicon oxide, silicon nitride, silicon oxynitride or silicon oxycarbide depositions), a process gas may be flowed into a first plasma region 215 through a gas inlet assembly 205. The process gas may be excited prior to entering the first plasma region 215 within a remote plasma system (RPS) 201. The process chamber 200 includes a lid 212 and showerhead 225. The lid 212 is depicted with an applied AC voltage source and the showerhead 225 is grounded, consistent with plasma generation in the first plasma region 215. An insulating ring 220 is positioned between the lid 212 and the showerhead 225 enabling a capacitively coupled plasma (CCP) to be formed in the first plasma region 215. The lid 212 and showerhead 225 are shown with an insulating ring 220 in between, which allows an AC potential to be applied to the lid 212 relative to the showerhead 225.

The lid 212 may be a dual-source lid for use with a processing chamber. Two distinct gas supply channels are visible within the gas inlet assembly 205. A first channel 202 carries a gas that passes through the remote plasma system (RPS) 201, while a second channel 204 bypasses the RPS 201. The first channel 202 may be used for the process gas and the second channel 204 may be used for a treatment gas. The gases that flow into the first plasma region 215 may be dispersed by a baffle 206.

A fluid, such as a precursor, may be flowed into a second plasma region 233 of the process chamber 200 through the showerhead 225. Excited species derived from the precursor in the first plasma region 215 travel through apertures 214 in the showerhead 225 and react with the precursor flowing into the second plasma region 233 from the showerhead 225. Little or no plasma is present in the second plasma region 233. Excited derivatives of the precursor combine in the second plasma region 233 to form a flowable dielectric material on the substrate. As the dielectric material grows, more recently added material possesses a higher mobility than underlying material. Mobility decreases as organic content is reduced by evaporation. Gaps may be filled by the flowable dielectric material using this technique without leaving traditional densities of organic content within the dielectric material after deposition is completed. A curing step may still be used to further reduce or remove the organic content from a deposited film.

Exciting the precursor in the first plasma region 215 alone or in combination with the remote plasma system (RPS) 201 provides several benefits. The concentration of the excited species derived from the precursor may be increased within the second plasma region 233 due to the plasma in the first plasma region 215. This increase may result from the location of the plasma in the first plasma region 215. The second plasma region 233 is located closer to the first plasma region 215 than the remote plasma system (RPS) 201, leaving less time for the excited species to leave excited states through collisions with other gas molecules, walls of the chamber and surfaces of the showerhead.

The uniformity of the concentration of the excited species derived from the precursor may also be increased within the second plasma region 233. This may result from the shape of the first plasma region 215, which is more similar to the shape of the second plasma region 233. Excited species created in the remote plasma system (RPS) 201 travel greater distances in order to pass through apertures 214 near the edges of the showerhead 225 relative to species that pass through apertures 214 near the center of the showerhead 225. The greater distance results in a reduced excitation of the excited species and, for example, may result in a slower growth rate near the edge of a substrate. Exciting the precursor in the first plasma region 215 mitigates this variation.

In addition to the precursors, there may be other gases introduced at varied times for varied purposes. A treatment gas may be introduced to remove unwanted species from the chamber walls, the substrate, the deposited film and/or the film during deposition. The treatment gas may comprise at least one of the gases from the group comprising of $H_2$, an $H_2/N_2$ mixture, $NH_3$, $NH_4OH$, $O_3$, $O_2$, $H_2O_2$ and water vapor. A treatment gas may be excited in a plasma and then used to reduce or remove a residual organic content from the deposited film. In other embodiments, the treatment gas may be used without a plasma. When the treatment gas includes water vapor, the delivery may be achieved using a mass flow meter (MFM) and injection valve or by other suitable water vapor generators.

In the embodiment, the dielectric layer can be deposited by introducing dielectric material precursors, e.g., a silicon containing precursor, and reacting processing precursors in the second plasma region 233. Examples of dielectric material precursors are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$-containing precursors, such as sillylamine and its derivatives including trisillylamine (TSA) and disillylamine (DSA), $Si_xN_yH_zO_{zz}$-containing precursors, $Si_x$-$N_yH_zCl_{zz}$-containing precursors, or combinations thereof.

Processing precursors include hydrogen-containing compounds, oxygen-containing compounds, nitrogen-containing compounds, or combinations thereof. Examples of suitable processing precursors include one or more of compounds selected from the group comprising of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing precursors may be plasma exited, such as in the RPS unit, to include N* and/or H* and/or O*-containing radicals or plasma, for example, $NH_3$, $NH_2$*, NH*, N*, H*, O*, N*O*, or combinations thereof. The process precursors may alternatively, include one or more of the precursors described herein.

The processing precursors may be plasma excited in the first plasma region 215 to produce process gas plasma and radicals including N* and/or H* and/or O* containing radicals or plasma, for example, $NH_3$, $NH_2$*, NH*, N*, H*, O*, N*O*, or combinations thereof. Alternatively, the processing precursors may already be in a plasma state after passing through a remote plasma system prior to introduction to the first plasma region 215.

The excited processing precursor 290 is then delivered to the second plasma region 233 for reaction with the precursors though apertures 214. Once in the processing volume, the processing precursor may mix and react to deposit the dielectric materials.

In one embodiment, the flowable CVD process performed in the process chamber 200 may deposit the dielectric materials as a polysilazanes based silicon containing film (PSZ-like film), which may be reflowable and fillable within trenches, features, vias, or other apertures defined in a substrate where the polysilazanes based silicon containing film is deposited.

In addition to the dielectric material precursors and processing precursors, there may be other gases introduced at varied times for varied purposes. A treatment gas may be introduced to remove unwanted species from the chamber walls, the substrate, the deposited film and/or the film during deposition, such as hydrogen, carbon, and fluorine. A processing precursor and/or treatment gas may comprise at least one of the gases from the group comprising $H_2$, a $H_2/N_2$ mixture, $NH_3$, $NH_4OH$, $O_3$, $O_2$, $H_2O_2$, $N_2$, $N_2H_4$ vapor, NO, $N_2O$, $NO_2$, water vapor, or combinations thereof. A treatment gas may be excited in a plasma and then used to reduce or remove a residual organic content from the deposited film. In other disclosed embodiments the treatment gas may be used without a plasma. When the treatment gas includes water vapor, the delivery may be achieved using a mass flow meter (MFM) and injection valve or by commercially available water vapor generators. The treatment gas may be introduced from into the first processing region, either through the RPS unit or bypassing the RPS unit, and may further be excited in the first plasma region.

Silicon nitrides materials include silicon nitride, $Si_xN_y$, hydrogen-containing silicon nitrides, $Si_xN_yH_z$, silicon oxynitrides, including hydrogen-containing silicon oxynitrides, $Si_xN_yH_zO_{zz}$, and halogen-containing silicon nitrides, including chlorinated silicon nitrides, $Si_xN_yH_zCl_{zz}$. The deposited dielectric material may then be converted to a silicon oxide like material.

The processing chamber, process and tool are more fully described in patent application Ser. No. 12/210,940, filed on Sep. 15, 2008, and patent application Ser. No. 12/210,982, filed on Sep. 15, 2008, which are incorporated herein by reference in their entireties.

Figure 3:
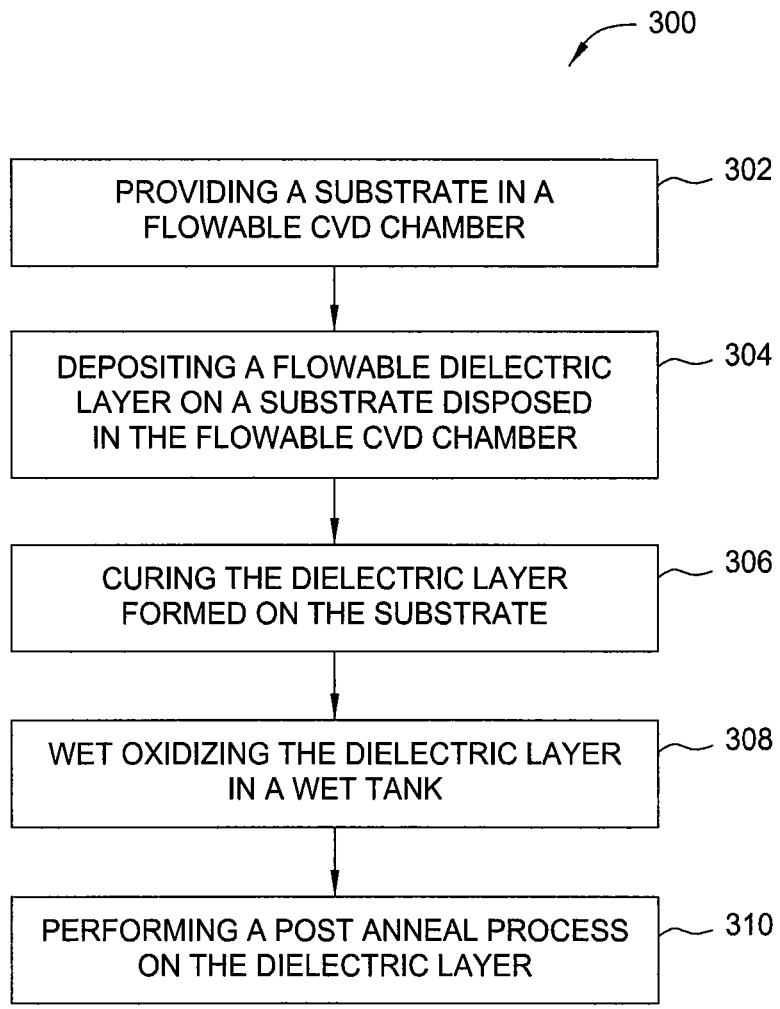
FIG. 3 is a process flow diagram illustrating a method incorporating one embodiment of the invention.

FIG. 3 is a flow diagram of one embodiment of a process 300 that may be practiced in the chamber 200, as depicted in FIG. 2, or other suitable processing chamber. FIGS. 4A-4E are schematic cross-sectional views of a portion of a substrate corresponding to various stages of the process 300. Although the process 300 is illustrated for forming a dielectric insulating material in trenches defined in a substrate, such as shallow trench isolation (STI) structure manufacture process, as depicted in FIGS. 4A-4E, the process 300 may be beneficially utilized to form other structures, such as interlayer dielectric (ILD) structures, on a substrate.

Figure 4A:
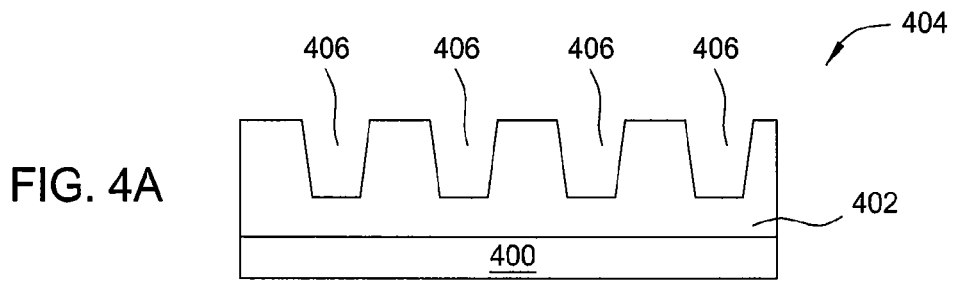
FIGS. 4A-4E are schematic cross-sectional views of a substrate having a dielectric material formed within trenches defined on the substrate.

The process 300 begins at step 302 by transferring (i.e., providing) a substrate 400, as depicted in FIG. 4A, to a deposition process chamber, such as the flowable chemical vapor deposition (CVD) chamber 200 depicted in FIG. 2. In one embodiment, the substrate 400 may be a silicon semiconductor substrate having a layer or layers formed thereon utilized to form a structure, such as shallow trench isolation (STI) structure 404 formed on the substrate 400. In another embodiment, the substrate 400 may be a silicon semiconductor substrate having multiple layers, e.g., a film stack, utilized to form different patterns and/or features. The substrate 400 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, metal layers disposed on silicon and the like. The substrate 400 may have various dimensions, such as 200 mm or 300 mm diameter wafers, as well as, rectangular or square panels.

In embodiment depicted in the present invention, the substrate 400 may be a silicon semiconductor substrate.

In one embodiment, a layer 402, as depicted in FIG. 4A, is disposed on the substrate 400 and is suitable to fabricate an STI structure 404. The layer 402 may be a silicon film, e.g., blanket bare silicon film. In embodiments wherein the layer 402 is not present, processes described as performed on the layer 402 may alternatively be on the substrate 400.

In one embodiment, the layer 402 may have etched or patterned to form trenches 406 within the layer 402 for manufacturing shallow trench isolation (STI) structure, which may be used for electrically isolating devices in an integrated circuit from one another. In addition, the STI structure 404 may be formed relative to transistor gate constructions and adjacent transistor source/drain regions with the substrate 400. The trenches 406 are formed within the layer 402 for device isolation.

Figure 4B:
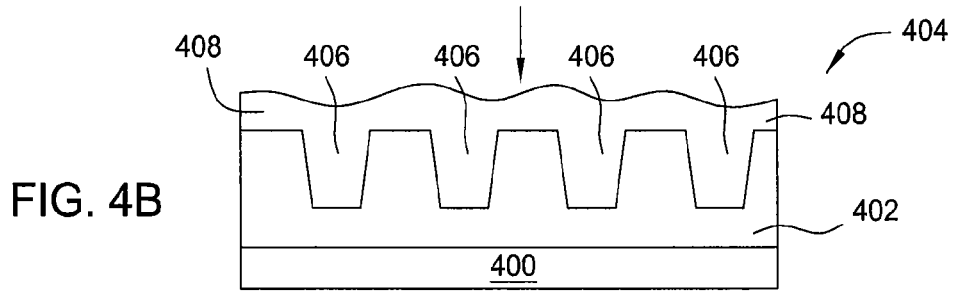

At step 304, a dielectric material 408 is deposited on the substrate 400 filling the trenches 406 defined within the layer 402, as shown in FIG. 4B. The dielectric material 408 may be deposited by the flowable chemical vapor deposition process performed in the process chamber 200, as described above with referenced to FIG. 2. In one embodiment, the dielectric material 408 is a silicon containing material deposited by the gas mixture supplied into the process chamber 200.

In one embodiment, the gas mixture supplied into the process chamber 200 for forming the dielectric material 408 may include a dielectric material precursor and a processing precursor. Suitable examples of the dielectric material precursor include silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$ containing precursors, such as sillyl-amine and its derivatives including trisillylamine (TSA) and disillylamine (DSA), $Si_xN_yH_zO_{zz}$ containing precursors, $Si_xN_yH_zCl_{zz}$ containing precursors, or combinations thereof. In one exemplary embodiment, the silicon containing precursor used for depositing the dielectric material 408 is trisillylamine (TSA). In addition, suitable examples of the processing precursors may include a nitrogen containing precursor. Suitable examples of the nitrogen containing precursor includes a $H_2/N_2$ mixture, $N_2$, $NH_3$, $NH_4OH$, $N_2$, $N_xH_y$ compounds including $N_2H_4$ vapor, NO, $N_2O$, $NO_2$ and the like. Furthermore, the processing precursors may also include hydrogen-containing compounds, oxygen-containing compounds or combinations thereof. Examples of suitable processing precursors include one or more of compounds selected from the group comprising of $H_2$, a $H_2/N_2$ mixture, $O_3$, $O_2$, $H_2O_2$, water vapor, or combinations thereof. The processing precursors may be plasma excited, such as in the RPS unit, to include N* and/or H* and/or O* containing radicals or plasma, for example, $NH_3$, $NH_2$*, NH*, N*, H*, O*, N*O*, or combinations thereof. The processing precursor may alternatively, include one or more of the precursors as needed. In one embodiment, the processing precursor used for depositing the dielectric material 408 is $NH_3$ gas.

In one embodiment, the substrate temperature during the deposition process is maintained at a predetermined range. In one embodiment, the substrate temperature is maintained at less than about 200 degrees Celsius, such as less than 100 degrees Celsius so as to allow the dielectric material 408 formed on the substrate to be flowable to reflow and fill within the trenches 406. It is believed that relative lower substrate temperature, such as less than 100 degrees Celsius, can assist maintaining the film initially formed on the substrate surface in a liquid-like flowable state, so as to preserve the flowability and viscosity of the resultant film formed thereon. As the resultant film is formed on the substrate having a certain degree of flowability and viscosity, the bonding structure of the film may be transformed, converted, replaced with or into different function groups or bonding structure after the subsequent thermal and wet processes. In one embodiment, the substrate temperature in the process chamber is maintained at a range between about room temperature to about 200 degrees Celsius, such as about less than 100 degrees Celsius, for example about 30 degrees Celsius and about 80 degrees Celsius.

The dielectric material precursor may be supplied into the processing chamber at a flow rate between about 1 sccm and about 5000 sccm. The processing precursors may be supplied into the processing chamber at a flow rate between about 1 sccm and about 1000 sccm. Alternatively, the gas mixture supplied during processing may also be controlled at a flow ratio of dielectric material precursor to processing precursor of between about 0.1 and about 100. The process pressure is maintained at between about 0.10 Torr to about 10 Torr, for example, about 0.1 Torr and about 1 Torr, such as about 0.5 Torr and about 0.7 Torr.

One or more inert gases may also be included with the gas mixture provided to the process chamber 200. The inert gas may include, but not limited to, noble gas, such as Ar, He, Xe, and the like. The inert gas may be supplied to the processing chamber at a flow ratio of between about 1 sccm and about 50000 sccm.

A RF power is applied to maintain the plasma during deposition. The RF power is provided between about 100 kHz and about 100 MHz, such as about 350 kHz or about 13.56 MHz. Alternatively, a VHF power may be utilized to provide a frequency up to between about 27 MHz and about 200 MHz. In one embodiment, the RF power may be supplied between about 1000 Watt and about 10000 Watt. The spacing of the substrate to the showerhead 225 may be controlled in accordance with the substrate dimension. In one embodiment, the processing spacing is controlled between about 100 mils and about 5 inches.

In one embodiment, the dielectric material 408 formed on the substrate 400 is a silicon containing material having nitride or hydrogen atoms, such as $Si_xN_yH_z$ or —Si—N—H— bonds, formed therein, where x is an integer greater than 1 to 200, y, z are integers from 0 to 400. Since the processing precursor supplied in the gas mixture may provide nitrogen and hydrogen species during depositing, the silicon atoms formed in the dielectric material 408 may contain —Si—N—H—, —Si—N—, or —Si—H— or other different bonding. The Si—N, N—H, Si—H bonds will be further replaced with Si—O—Si bond by the subsequent thermal and wet processes to form the dielectric material 408 as a silicon oxide layer.

Figure 4C:
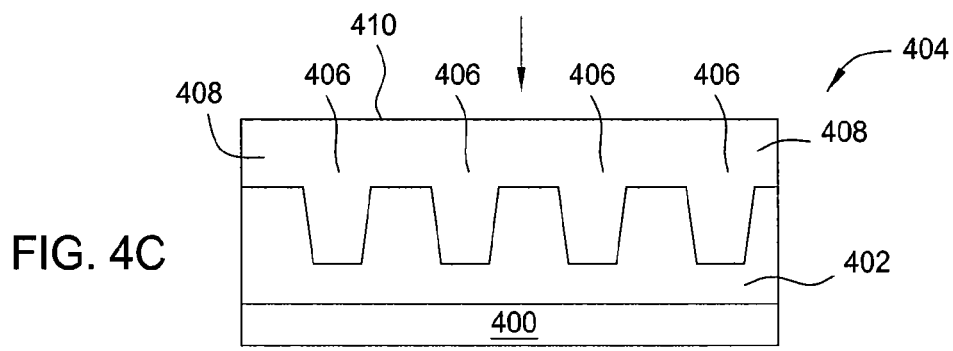
Figure 4D:
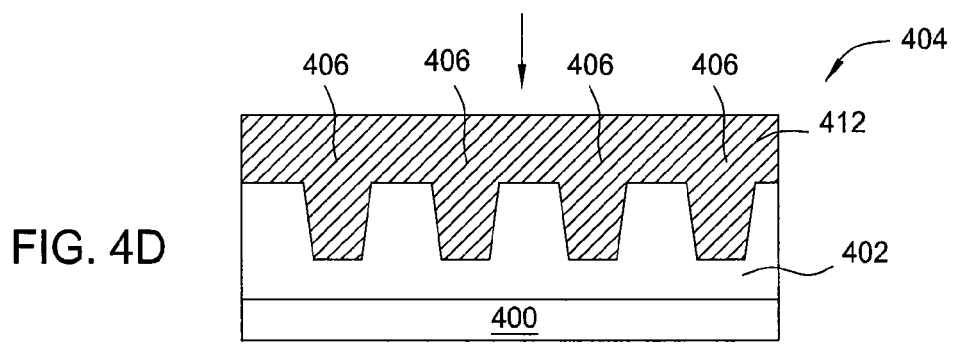

At step 306, after the dielectric material 408 is formed on the substrate 400, the substrate 400 is cured and/or thermally processed to bake the dielectric material 408. The curing/baking process removes the moisture from the deposited dielectric material 408 so as to form a solid phase dielectric material 408, as shown in FIG. 4C. As the dielectric material 408 is cured, moisture and solvent in the deposited dielectric material 408 is driven out, resulting the deposited dielectric material 408 to refill and reflow within the trenches 406 defined within the substrate 400, thereby forming a substantially planar surface 410 on the substrate 400. In one embodiment, the curing process performed at step 306 may be executed on a hot plate, a oven, a heated chamber or suitable tools that may provide sufficient heat to the substrate 400.

In one embodiment, the curing temperature may be controlled at below 100 degrees Celsius, such as below 80 degrees Celsius, for example about 50 degrees Celsius. The curing time may be controlled at between about 1 seconds and about 10 hours.

At step 308, a wet oxidation process may be performed on the substrate 400 after the curing process of step 306. After the curing process of step 306, the dielectric material 408 formed on the substrate 400 has not yet densified and the structures of the Si—N, N—H, Si—H bonding are still remaining as the main bonding structures formed in the dielectric material 408. Accordingly, the wet oxidation process as performed at step 308 modifies the chemical composition of the dielectric material 408 to replace the Si—N, N—H, Si—H bonding with Si—O—Si or Si—O bonding and network structure to oxidize the dielectric material 408. The wet oxidation process increases the percentage by weight of the oxygen elements formed in the dielectric material 408 while reduces the percentage by weight of the nitrogen and hydrogen elements formed therein.

Figure 4E:
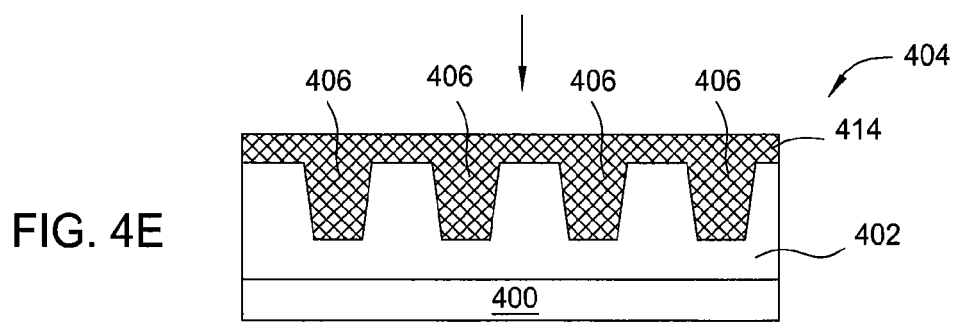

In one embodiment, the substrate 400 is placed, immersed, dipped, flooded, or wet treated to perform the wet oxidation process at step 308. In one embodiment, the substrate 400 is wetted by a liquid bath contained in a wet tank, such as a wet processing tank 500, which will be described further below with reference to FIG. 5, to perform the wet oxidation process. It is noted that the substrate 400 may also be processed in any other suitable processing container, including those from other manufacturers. It is believed that the wet oxidation process may initiate the oxygen replacement process in the dielectric material 408, thereby triggering a chain-reaction like process within the dielectric material 408 to rapidly replace the nitrogen and/or the hydrogen bonds with oxygen bonds. After the oxidation replacement process, a strong silicon oxide bonding (—O—Si—O) may be formed in the oxidized dielectric material 412, as shown in FIG. 4E.

The wet oxidation processing solution used to perform the wet oxidation process on the substrate 400 provides oxygen sources to replace and convert the nitrogen and hydrogen elements formed in the dielectric material 408 into oxygen elements. In one embodiment, the wet oxidation processing solution may include ozonated deionized (DI) water, e.g., ozone comprised in deionized (DI) water. Other oxygen source, such as $O_2$, $N_2O$, $NO_2$, $H_2O$ vapor or steam, $H_2O_2$ and the like may also be used in deionized (DI) water to perform the wet oxidation process. Furthermore, suitable acid or based solution, such as SC1 (e.g., s dilution of $NH_4OH/H_2O_2$) or SC2 solution (e.g., dilution of $HCl/H_2O_2$) may also be used to perform the wet oxidation process. In one embodiment, the ozone source is constantly bubbled and supplied into the deionized (DI) water solution, forming a saturated ozonated deionized (DI) water to wet oxidize the substrate 400 immersed in the solution. In one embodiment, the concentration of the ozone included in the deionized (DI) water for the wet oxidation process is controlled between about 1 milligram (mg) per liter (L) and about 1000 milligram (mg) per liter (L).

In one embodiment, the wet oxidation solution/bath may be controlled at a temperature less than 100 degrees Celsius, such as less than about 80 degrees Celsius, for example about less than 75 degrees Celsius. It is believed that the relatively low temperature wet oxidation process may reduce the thermal budget generated to the substrate 400, thereby reducing the likelihood of damaging the film layers or devices structures formed on the substrate 400. In addition, it is also found that performing the wet oxidation process at a temperature greater than 45 degrees Celsius may promote a higher oxidation rate of the dielectric material 408, which may efficiently oxidize the dielectric material 408 at a shorter time. In one example, the temperature of the wet oxidation process may be controlled at greater than 40 degrees Celsius but less than 100 degrees Celsius. For example, the temperature of the wet oxidation process may be controlled at about 45 degrees Celsius.

Furthermore, the wet oxidation processing solution provides a low cost, fast and simple process so that the overall process complexity may be reduced while also reducing manufacturing cost and process cycle time. In one embodiment, the process time for the wet oxidation process performed on the substrate 400 may be controlled at between about 1 seconds and about 10 hours. Alternatively, the process time may also be controlled by observing the bonding structures formed in the oxidized dielectric material 412 until a desired percentage or atomic weight of the silicon-nitrogen and/or silicon-hydrogen bonding in the dielectric material 408 have been converted into the silicon-oxygen bonding. The bonding structure of the oxidized dielectric material 412 may be inspected or observed by FTIR, SIMS or XPS.

In one example, FTIR measurement equipment may be utilized to inspect the bonding structure of the oxidized dielectric material 412. In the FTIR spectrum, when the Si—O signal at about 1080 nm is increased while Si—N signal at about 835-860 nm and/or the Si—H signal at about 2154-2180 nm is decreased, at least part of the silicon nitrogen bonding and/or silicon hydrogen bonding have been replaced or converted into silicon-oxygen bonding. The silicon oxygen signal is increased when the wet oxidation process time increased. Therefore, a proper process time may be determined when the silicon-oxygen bonding signal has reached to a desired intensity. In one embodiment, the wet oxidation process may be terminated when the intensity of the silicon-oxygen signal is about greater than 90 percent of the sum of the peak intensity. In an exemplary embodiment, the process time for the wet oxidation process is controlled at between about 0.5 hours and about 3 hours.

In the embodiment wherein the SIMS or XPS measurement equipment is used, the wet oxidation process may be terminated when the oxygen elements formed in the oxidized dielectric material 412 is greater than 50 percent by atomic weight.

At step 310, the oxidized dielectric material 412 is exposed to a thermal annealing process to form an annealed dielectric material 414, as shown in FIG. 4E. An example of a suitable thermal anneal chamber in which step 310 may be performed is the CENTURA® RADIANCE® RTP chamber, available from Applied Materials, Inc., among others. It is noted other types of anneal chamber or RTP chamber, including those from other manufactures, may also be utilized to perform the thermal annealing process as described in step 310.

In one embodiment of step 310, the substrate 400 may be heated to a temperature from about 100 degrees Celsius to about 1000 degrees Celsius. In one embodiment, the duration of the thermal annealing process may be from about 1 second to about 180 seconds, for example, about 2 seconds to about 60 seconds, such as about 5 seconds to about 30 seconds. At least one annealing gas is supplied into the chamber for thermal annealing process. Examples of annealing gases include oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), derivatives thereof or combinations thereof. The annealing gas may contain nitrogen and at least one oxygen-containing gas, such as oxygen. The chamber may have a pressure from about 0.1 Torr to about 100 Torr, for example, about 0.1 to about 50 Torr, such as 0.5 Torr. In one example of a thermal annealing process, substrate 400 is heated to a temperature of about 600 degrees Celsius for about 60 seconds within an oxygen atmosphere. In another example, substrate 400 is heated to a temperature of about 1000 degrees Celsius for about 10 seconds to about 60 seconds within an atmosphere containing equivalent volumetric amounts of nitrogen and oxygen during the annealing process.

It is believed that the thermal annealed process performed at step 310 may assist densifying the film structures and modify the chemical structure of the dielectric material 414 formed on the substrate 400, thereby providing stronger bonding structures and silicon oxygen bonding in the resultant annealed dielectric material 414. Furthermore, the thermal annealing process may also assist driving out the dangling bonds or weak silicon-hydrogen bonding from the dielectric material 414, thereby reducing the film leakage and improving film quality.

Figure 5:
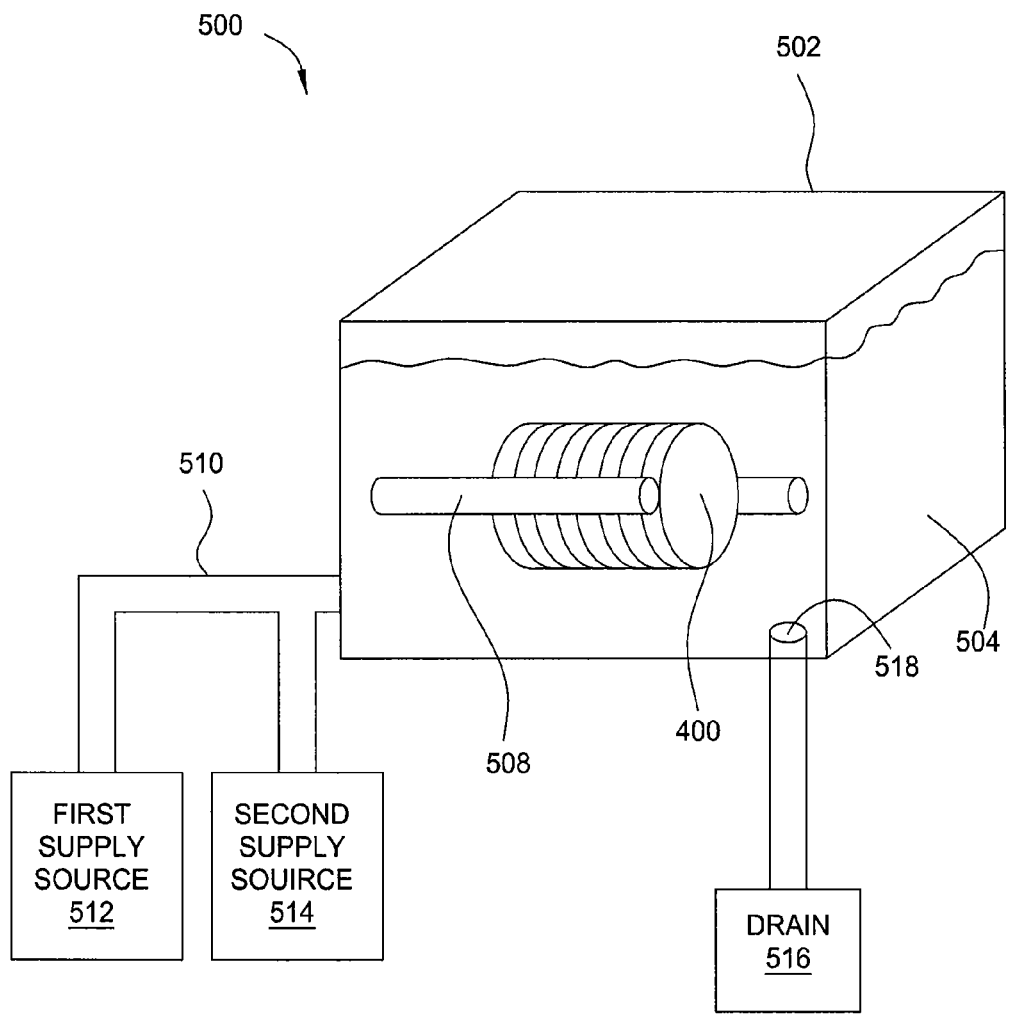
FIG. 5 is a schematic cross-sectional view of a wet process tank that may be used according to one embodiment of the invention.

FIG. 5 depicts a schematic cross-sectional view of a wet processing tank 500 in which the wet oxidation process descried at step 308 may be performed. The wet processing tank 500 generally include a tank 502 having an interior volume that may contain a wet oxidation processing solution 504, such as described with reference to step 308. It is noted that other suitable liquid, fluid, bath or the like may also be used in the tank 502 to perform the wet oxidation process. The tank 502 may have a rack 508 disposed therein to support a plurality or a batch of substrates 400 to be positioned therein for processing. Alternatively, the plurality of substrates 400 may be secured or positioned in the tank 502 is any other suitable manner, such as inserted and supported within a cassette, which may hold and secure the substrates 400 at desired positions. It is noted that the tank 502 may also be utilized to perform wet oxidization process for a single substrate as needed.

The plurality of substrate 400 are immersed, flooded, placed, wetted, processed, sprayed or dipped in the processing solution 504 disposed in the tank 502 for processing. The tank 502 may includes a first supply source 512 and a second supply source 514 that may supply processing liquid or processing solution into the tank 502 through an inlet port 510. In one embodiment, the first supply source 512 may supply deionized (DI) water into the tank 502 and the second supply source 514 may supply oxygen containing source into the tank 502. As discussed above, suitable oxygen containing source that may be supplied from the second supply source 514 to the tank 502 may include $O_3$, $O_2$, $N_2O$, $NO_2$, $H_2O$ vapor or steam, $H_2O_2$, combinations thereof and the like. Alternatively, the second supply source 514 may also supplied other suitable acid or based solution, such as SC1 (e.g., s dilution of $NH_4OH/H_2O_2$) or SC2 solution (e.g., dilution of $HCl/H_2O_2$), into the tank 502 to perform the wet oxidation process. In one exemplary embodiment depicted therein, the oxygen containing source supplied from the second supply source 514 is ozone that may be continuously bubbled or supplied into the tank 502, mixing with the deionized (DI) water supplied from the first supply source 512 to form the processing solution 504 in the tank 502 for performing the wet oxidation process on the substrates 400 immersed in the tank 502.

Thus, a method of depositing a dielectric layer that includes performing a wet oxidation process on a silicon containing dielectric material. The method is particularly suitable for depositing dielectric material filling trenches or vias defined within a substrate. The wet oxidation process advantageously replaces and converts silicon-nitrogen and/or silicon-hydrogen bonding formed in the silicon containing dielectric material into silicon-oxygen bonding, thereby providing a desired silicon oxide layer with strong bonding structures and high film quality.

While the foregoing is directed to embodiments of the present invention, other and further embodiments of the invention may be devised without departing from the basic scope thereof, and the scope thereof is determined by the claims that follow.

What is claimed is:

1. A method of forming an oxidized material on a substrate, comprising:
   forming a silicon containing layer on a substrate by a flowable CVD process comprising exposing the substrate to trisilylamine and ammonia;
   removing moisture from the silicon containing layer disposed on the substrate;
   subsequently immersing the silicon containing layer into a processing solution having an oxygen source, wherein the oxygen source in the processing solution at least partially replaces silicon nitrogen or silicon hydrogen bonds in the silicon containing layer with silicon oxygen bonds; and
   forming an oxidized silicon containing layer on the substrate.

2. The method of claim 1, wherein the processing solution includes an oxygen source disposed in deionized (DI) water.

3. The method of claim 2, wherein the oxygen source is $O_3$.

4. The method of claim 1 further comprising:
   performing a thermal anneal process on the oxidized silicon containing layer to anneal the substrate to a temperature between about 100 degrees Celsius and about 1000 degrees Celsius.

5. A method of forming an oxidized dielectric material on a substrate, comprising:
   forming a silicon containing layer on a substrate by a flowable CVD process, wherein the silicon containing layer is formed by exposure to a gas mixture containing trisilylamine (TSA) and $NH_3$;
   curing the silicon containing layer disposed on the substrate;
   subsequently wetting the silicon containing layer with a processing solution having $O_3$ disposed in deionized (DI) water, wherein the ozone disposed in the deionized (DI) water has a concentration between about 1 milligram (mg) per liter (L) and about 1000 milligram (mg) per liter (L); and
   forming an oxidized silicon containing layer on the substrate.

6. The method of claim 5, wherein the oxygen source provided from $O_3$ in the processing solution at least partially coverts silicon nitrogen or silicon hydrogen bonding formed in the silicon containing layer into silicon oxygen bonding.

7. The method of claim 5, further comprising:
   performing a thermal anneal process on the oxidized silicon containing layer to anneal the substrate to a temperature between about 100 degrees Celsius and about 1000 degrees Celsius.

* * * * *